(12) United States Patent
Roden et al.

(10) Patent No.: US 6,856,137 B2
(45) Date of Patent: Feb. 15, 2005

(54) GROUND FAULT DETECTION SYSTEM AND METHOD

(75) Inventors: Garey George Roden, Apalachin, NY (US); Peter Alexander Carruthers, Ithaca, NY (US)

(73) Assignee: Bae Systems Controls Inc., Johnson City, NY (US)

( * ) Notice: Subject to any disclaimer, the term of this patent is extended or adjusted under 35 U.S.C. 154(b) by 0 days.

(21) Appl. No.: 10/078,908

(22) Filed: Feb. 19, 2002

(65) Prior Publication Data

US 2003/0155928 A1 Aug. 21, 2003

(51) Int. Cl.$^7$ .............................................. G01R 31/14
(52) U.S. Cl. ........................ 324/509; 324/510; 361/42
(58) Field of Search ................... 324/509, 510; 361/42, 45

(56) References Cited

U.S. PATENT DOCUMENTS

| | | | | |
|---|---|---|---|---|
| 5,214,575 A | * | 5/1993 | Sugishima et al. ........... 361/42 |
| 5,309,349 A | * | 5/1994 | Kwan ........................... 363/98 |
| 5,420,740 A | | 5/1995 | MacKenzie et al. .......... 361/45 |
| 5,481,194 A | * | 1/1996 | Schantz et al. .............. 324/522 |
| 5,541,800 A | | 7/1996 | Misencik ...................... 361/45 |
| 5,561,380 A | | 10/1996 | Sway-Tin et al. ........... 324/509 |
| 5,686,839 A | * | 11/1997 | Takagi .......................... 324/510 |
| 5,706,159 A | * | 1/1998 | Dollar et al. ................ 324/536 |
| 5,835,322 A | | 11/1998 | Smith et al. ................... 361/45 |
| 5,894,393 A | | 4/1999 | Elliott et al. .................. 361/42 |
| 5,930,093 A | | 7/1999 | Morrissett ..................... 361/42 |
| 5,945,802 A | * | 8/1999 | Konrad et al. ................ 361/42 |
| 6,456,946 B1 | * | 9/2002 | O'Gorman ..................... 702/58 |
| 2002/0121902 A1 | * | 9/2002 | Suzuki ......................... 324/509 |

OTHER PUBLICATIONS

Lefferson, DC Leakage Current Detector Protects the High Voltage Equipment User, pp. 34, 35 and 37 (Sep. 2000).

* cited by examiner

*Primary Examiner*—N. Le
*Assistant Examiner*—Timothy J. Dole
(74) *Attorney, Agent, or Firm*—Edward J. Howard; Geoffrey H. Krauss (57) ABSTRACT

In one embodiment, an AC ground fault detector system senses an AC signal indicative of an unintended electrical path between a load driven by a power source and a reference potential using a capacitively coupled circuit.

12 Claims, 5 Drawing Sheets

GROUND FAULT DETECTION SYSTEM AND METHOD

RELATED APPLICATIONS

None.

FIELD OF THE INVENTION

The present invention relates to ground fault protection, and more particularly to an AC ground fault sensor system for detecting ground fault conditions.

BACKGROUND OF THE INVENTION

Electrically powered automobiles are vehicles that do not depend on internal a combustion engines for propulsive power, but rather on relatively large electric traction batteries. The traction battery of an electric automobile is engaged with an electric traction motor for propelling the automobile, and the traction battery is rechargeable to permit repeated use of the traction battery.

The skilled artisan will appreciate that a traction battery must have a relatively large capacity, and must deliver a relatively large amount of power, compared to a conventional 12 volt automobile storage battery. It is further understood that because power is directly proportional to battery voltage and system current, the high power delivery requirements which must be satisfied by traction batteries necessarily mean that higher electrical voltages will be present in electric automobiles than in automobiles powered by fossil fuels, which typically require only a comparatively low power, low voltage storage battery for energizing auxiliary loads when the internal combustion engine is not operating.

Hybrid electric vehicles (BEVs) combine the internal combustion engine of a conventional vehicle with the battery and electric motor of an electric vehicle. This results in an increase in fuel economy over conventional vehicles. This combination also offers extended range and rapid refueling that users expect from a conventional vehicle, with a significant portion of the energy and environmental benefits of an electric vehicle. The practical benefits of HEVs include improved fuel economy and lower emissions compared to conventional vehicles. The inherent flexibility of HEVs also permits their use in a wide range of applications, from personal transportation to commercial hauling.

Because electric or hybrid electric vehicles require little or no combustion of fossil fuels, such vehicles produce little or no environmentally harmful emissions, in contrast to fossil fuel powered vehicles. Such vehicles are become increasingly attractive alternatives to fossil fuel powered cars. However, because of the high voltage requirements of its traction battery an electric or hybrid electric vehicle raises significant electrical safety concerns.

For example, unwanted electric current flow outside of the intended electric circuit flow (i.e. ground fault conditions) may cause significant damage to electronic components within a system (such as an HEV propulsion system), thereby disabling or even destroying the electronic equipment. In addition, such ground fault conditions may result in an electric shock, which can have graver consequences when the shock is caused by contact with a high voltage traction battery system, as compared to a conventional, relatively low voltage automotive storage battery system. To reduce the likelihood of such shock, many traction battery systems are not grounded to the automobile chassis, in contrast to conventional automotive storage battery systems. Instead, many traction battery systems have a closed loop return path, so that the negative power conductor of the system (i.e., the electrical current return path) is isolated from the chassis of the electric or hybrid electric vehicle.

While such isolated systems may minimize the likelihood of a significant electric shock to a person in the event of a short circuit or low impedance connection between a phase lead of a motor and the chassis (i.e a ground fault), certain electronic components typically in electrical communication with the positive and negative power conductors or rails that supply power to drive the motor, are subject to damage resulting from extreme voltage or current swings occurring on the positive and negative rails. Further, while substantial work has been performed on detecting DC ground faults in high voltage DC systems, such DC ground fault detection schemes fail to detect ground faults on AC outputs of the DC system such as motors, generators or other loads. A ground fault detection system for sensing an AC ground fault condition associated with a given load such as a motor and operable to interrupt power thereto is desired.

SUMMARY OF THE INVENTION

An AC ground fault detector system for sensing an AC signal indicative of an unintended electrical path between a load driven by a power source and a reference potential comprises a first power conductor coupled to a first terminal of the power source and a second power conductor coupled to a second terminal of the power source. A switching mechanism coupled to the first and second power conductors is operative for alternately connecting a phase of the load with the first and second power conductors according to a predetermined switching rate, whereby, during normal operation, voltages developed at the first power conductor and second power conductor are substantially constant with respect to a reference potential. In the event of an occurrence of the unintended electrical path of at least one phase of the load with the reference potential, time varying voltages are developed at the first power conductor and second power conductor associated with the switching rate. A detector is coupled at an input port to the first power conductor for receiving the voltage or current signal on the first power conductor. The detector includes a processing circuit for processing the received signal and comparing with a threshold value, and an output port for generating an output signal based on said comparison; whereby the occurrence of the unintended electrical path between the load and reference potential causes a change in the voltage or current signal on the first power conductor of sufficient magnitude relative to the threshold value for detection by the detector such that the output signal of the detector is indicative of a detected fault.

A power system for driving a load comprises a power distribution unit for distributing power via first and second power conductors to a corresponding at least one lead of the load according to a switching mechanism which selectively couples a given lead of the load to one of the first and second power conductors at a predetermined switching rate. The first and second power conductors are capacitively coupled to one another. A capacitor has a first terminal coupled to one of the first power conductor and second power conductor, and a second terminal coupled to the reference potential. A detector circuit is coupled to the first power conductor and is operative for sensing a change in voltage across the first power conductor with respect to the reference potential indicative of an unintended electrical path between the lead and the reference potential which causes the voltage developed across the first power conductor with respect to the reference potential to vary according to the magnitude of the power source, the detector generating a fault signal in response to the sensed voltage change exceeding a predetermined threshold. A controller responsive to the fault signal is operative to interrupt power from the first and second power conductors to the load, thereby tending to eliminate the time varying voltage developed at one of the first and second power conductors in response to the unintended electrical path between the lead and the reference potential, from being discharged across the capacitor.

It is embodied in an aspect of the present invention a method for detecting an unintended electrical path between a phase lead of a motor and reference potential during power servicing of the motor by a power unit, the motor being selectively coupled to one of first and second power conductors according to a switching mechanism at a predetermined switching rate, and wherein an at least one capacitor is coupled between one of the first power conductor and second power conductor, and the reference potential, the method including steps of sensing a voltage signal on the first power conductor relative to the reference potential; filtering the sensed voltage signal to obtain a filtered signal component; comparing the filtered signal component with a threshold value; and interrupting the servicing of power to the motor when the filtered signal component exceeds the threshold value.

BRIEF DESCRIPTION OF THE DRAWINGS

The advantages, nature, and various additional features of the invention will appear more fully upon consideration of the illustrative embodiments now to be described in detail in connection with accompanying drawings where like reference numerals identify like elements throughout the drawings.

DETAILED DESCRIPTION OF THE INVENTION

Figure 1:
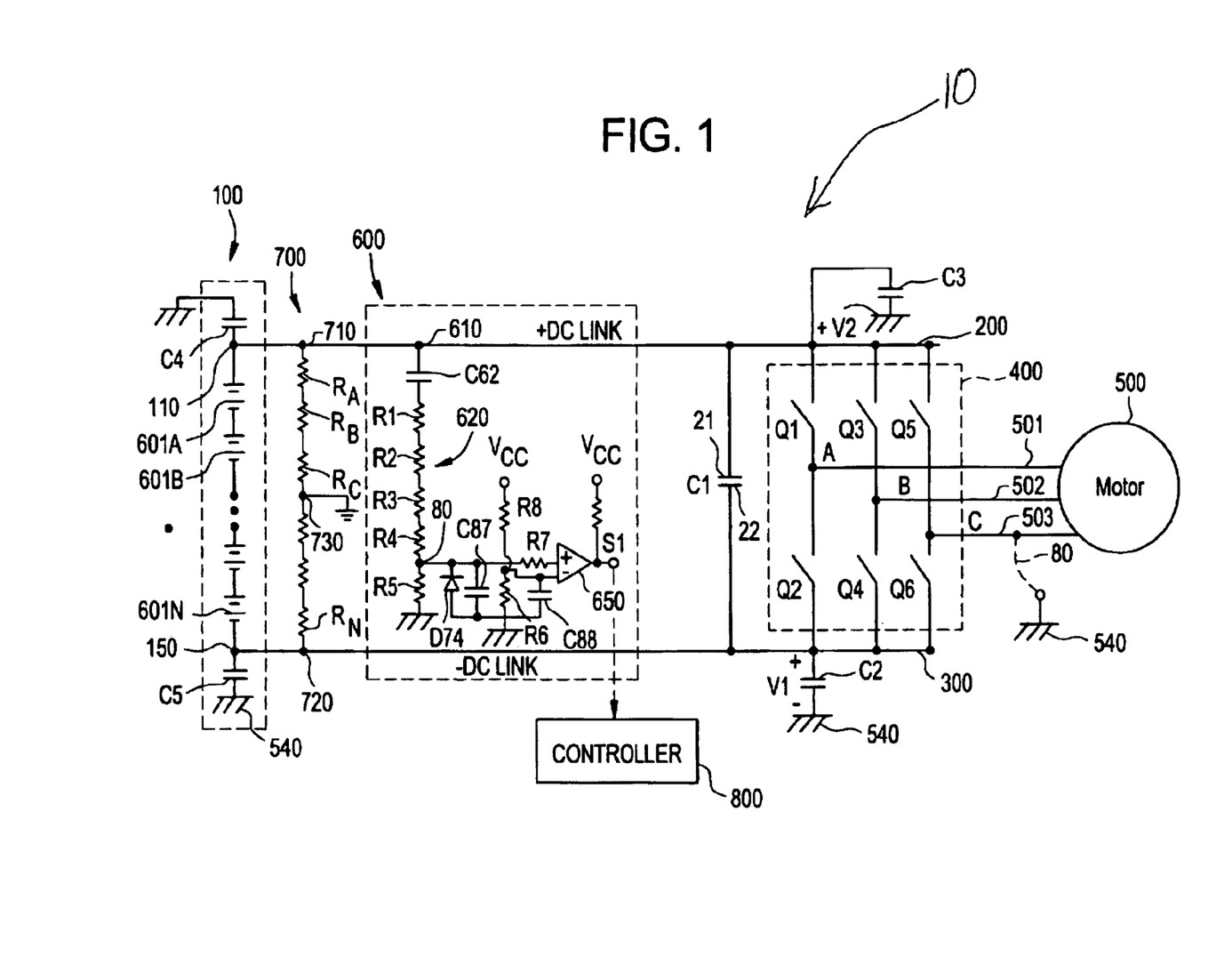
FIG. 1 shows a schematic illustration of an AC ground fault detection system according to an aspect of the present invention.

FIG. 1 shows an AC ground fault detector system 10 according to an aspect of the invention for sensing an AC signal indicative of an unintended electric path such as a short circuit or very low impedance connection between a load 500 such as an AC motor, and reference potential 540 such as chassis or ground. Power source 100 comprises a string of batteries 601A, 601B, . . . 601N for providing a high voltage (e.g. 600V) power source for driving motor 500 such as an electric traction motor. Terminal 110 of power source 100 is electrically coupled to motor 500 via a first power conductor 200, thereby providing a positive DC link with the motor, while terminal 150 is electrically coupled to motor 500 via second power conductor 300 for providing a negative DC link. A switching mechanism 400 such as an inverter is coupled between the first and second power conductors for alternately connecting a given phase lead 501, 502, 503 of motor 500 with one of the first and second power conductors for energizing the motor to thereby propel a device such as an automobile. In an exemplary embodiment shown in FIG. 1, the switching mechanism comprises pairs of switches (Q1–Q2, Q3–Q4, Q5–Q6) with each pair having a respective common terminal (A, B, C) coupled to a respective phase lead (501, 502, 503) of the multi-phase motor. Each of the switches, although illustrated as mechanical switches, may take the form of electronic semiconductor switching devices including FET transistors, IGBTs, bipolar transistors, and SCRs, for example. The switches open and close (i.e. turn "OFF" and "ON") according to a predetermined switching rate to selectively couple power to a given phase via either the positive or negative power conductor links. In a preferred embodiment, the switches are pulse-width modulated to drive the various motor phases and create an AC waveform.

A high impedance network 700 coupled between the first and second power conductors operates to balance the high voltage battery string equally between the positive and negative voltage values with respect to the ground reference potential (i.e. chassis) voltage 540. The high impedance network 700 comprises resistors Ra, Rb, . . . , Rn connected in series and having a first terminal 710 coupled to first power conductor 200, a second terminal 720 coupled to second power conductor 300 and a third terminal 730 coupled to ground reference potential 540. Preferably, each of the resistors Ra, . . . , Rn is of equal resistance and arranged such that the magnitude of the voltage at node 710 with respect to ground 730 is equal to the magnitude of the voltage at node 720 with respect to ground 730.

Still referring to FIG. 1, there is shown capacitor C1 having a first terminal 21 coupled to first power conductor 200 (positive power conductor) and a second terminal 22 coupled to second power conductor (negative power conductor) for capcitively coupling the first and second power conductors to stabilize or maintain the voltage difference between the positive conductor 200 and negative conductor 300. In an exemplary embodiment, capacitor C1 may have a capacitance of about 1000 microFarads ($\mu F$). Capacitor C2 is coupled between second power conductor 300 and ground or chassis 540, while capacitor C3 is coupled between the first power conductor 200 and ground (chassis). In an exemplary embodiment, capacitors C2 and C3 may have a capacitance ranging from about 1 micro Farad to about 5 micro Farads. Capacitors C2 and C3 operate to stabilize the battery pack or power source 100 with respect to ground by filtering the signals on the first and second power conductors resulting from switch (Q1–Q6) openings and closings due to capacitance (not shown) between the various phases of the motor and the chassis or ground. Capacitors C4 and C5 associated with power source 100 may also be included and operate to stabilize the +DC and –DC links at the power source. Capacitor C4 is coupled between the positive voltage at node 10 and ground, while capacitor C5 is coupled between the negative voltage at node 150 and ground.

AC ground fault detector circuit 600 is coupled to first power conductor 200 at node 610 for receiving a voltage or current signal on the first power conductor, processing the received signal and comparing with a threshold value for detecting an AC signal indicative of a ground fault associated with the load. Detector circuit 600 comprises processing circuitry 620 including capacitor C62 having a first terminal coupled to first power conductor at node 610 and a second terminal coupled to a resistive network comprising resistors R1–R4 connected in series. Resistor R5 coupled between resistor R4 and chassis operates as a voltage divider to provide an attenuated signal for processing by the comparator circuitry. In an exemplary embodiment, capacitor C62 may have a capacitance of about 1000 picoFarads (pF). Resistors R1–R4 may have substantially equal resistances (e.g. R1,R2,R3,R4=250 kilo-ohms kΩ) while resistor R5 may have a value of about 10 kΩ. Diode D74 is connected in parallel with capacitor C87 at node 80 to provide additional filtering of the signal for input to the inverting input (+) of comparator 650. Resistor R7 connected between node 80 and the non-inverting input of comparator 650 provides balancing of the input impedance to the comparator. A threshold voltage Vth is provided at the non-inverting input (−) of comparator 650 via voltage divider network comprising resistors R6 and R8 and capacitor filter C88. The comparator compares the signal provided at the non-inverting input with the threshold voltage provided at the inverting input to generate an output signal S1 that corresponds to the detection (or non-detection) of an AC ground fault.

Operation of the AC ground fault sensor system shown in FIG. 1 is described below. In normal operation, (i.e. when no AC ground fault exists) a voltage V of for example, 600 volts provided by power supply 100 is developed between the positive and negative power conductors (200, 300). The voltage V1 developed across capacitor C2 coupled to the negative power conductor 300 would be −300V with respect to chassis. The voltage V2 developed across capacitor C3 coupled to the positive conductor 200 would be +300V with respect to chassis. Capacitor C62 of detection circuit 600 would thus have a voltage of +300V in normal or steady state operation, with no voltage drop across the resistor network of resistors R1–R5. The non-inverting input of comparator 650 would therefore be at a voltage $V_+ = 0V$, which is less than the threshold voltage Vth input at the inverting input of the comparator. In an exemplary embodiment, the threshold voltage Vth is approximately 2.5 volts, with a Vcc supply voltage input to the comparator of about 5 volts. Thus, in normal operation, the comparator output would be in an inactive or "LOW" state.

As previously mentioned, capacitors C2 and C3 operate to stabilize the power carried by the positive and negative conductors with respect to chassis due to switching of the motor capacitance attached to chassis (not shown) when switches (Q1–Q6) are turned ON and OFF at the predetermined switching rate. In this manner, the low ripple voltages or currents developed on positive conductor 200 and input to ground fault detector 600 are below the threshold voltage and hence the output S1 of comparator 650 is "LOW" and do not trigger detection of an AC ground fault.

However, upon occurrence of an AC ground fault caused, for example, by a breakdown in insulation between the motor winding and chassis or other improper electrical connection, an unintended electrical path (such as a short circuit or very low impedance connection) exists between the chassis or ground and one of the phases of the motor. Reference numeral 80 schematically illustrates an AC ground fault or short circuit electrical communication path between phase C of motor 500 and chassis or ground reference potential 540. It is understood that the term "short circuit" as used encompasses all such unintended electrical paths as described herein, including low impedance paths and unwanted AC electric current flow outside of the intended circuit flow. In this example, closing of one of switches Q5 or Q6 associated with phase C causes either the positive conductor 200 (when Q5 closes) or the negative conductor 300 (when Q6 closes) to be connected directly to chassis, with the other power conductor having the entire DC power supply voltage V there across. That is, in the event of a ground fault, closing of switch Q5 causes the positive conductor 200 to be electrically connected to chassis or ground reference potential (i.e. 0V) through switch Q5. This of course means that negative power conductor 300 has a voltage V1 of −600V with respect to chassis. Opening switch Q5 and closing switch Q6 causes the negative power conductor 300 to be electrically connected to chassis or ground potential (0V) through switch Q6, thereby resulting in a voltage of +600V developed across the positive power conductor 200. Thus, the voltage across each of the positive and negative power conductors is no longer constant with respect to chassis, but alternates from 0V to +600V with respect to chassis for positive conductor 200, and from −600V to 0V with respect to chassis for negative conductor 300 for each switching cycle. This oscillation is manifest by a square wave signal carried by the power conductors and applied across each of capacitors C2–C3 so that the capacitors are alternately charging and discharging these high voltages at high frequencies or switching rates (e.g. at a switching frequency of about 7.5 kHz). Such high rate, high voltage swings resulting from the short circuit exceed the stress limits of these devices, and if gone undetected, damage or destroy these capacitors as well as other electronic components within the system. The ground fault detector circuit 600 provides a simple and cost effective solution by sensing the presence of the square wave voltage caused by the fault through the series capacitive/resistive circuit and sending an output signal to controller 800 such as a programmable logic array for opening all of the switches, thereby interrupting power and protecting the capacitors and other external components from damage.

Figure 2A:
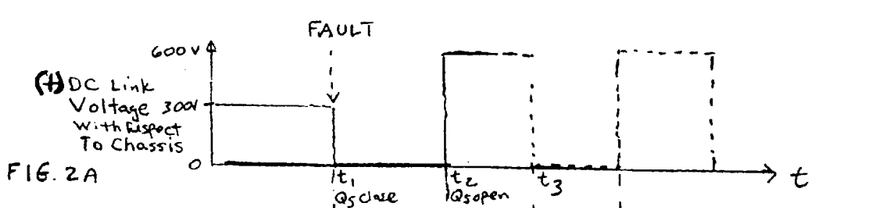
FIGS. 2A–2E illustrate a first series of timing diagrams associated with the occurrence of an unintended electric path such as a short circuit of a phase of an AC motor with the chassis.
Figure 2B:
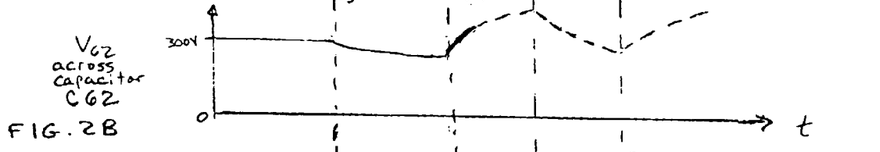
Figure 2C:
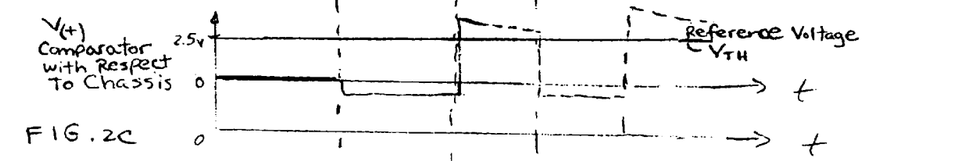
Figure 2D:
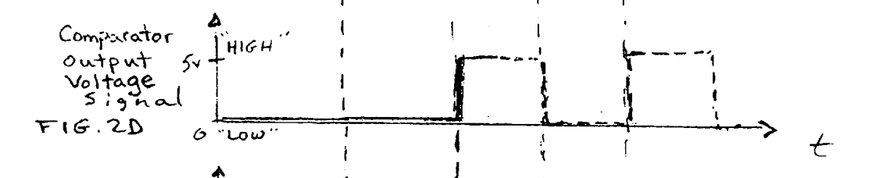
Figure 2E:
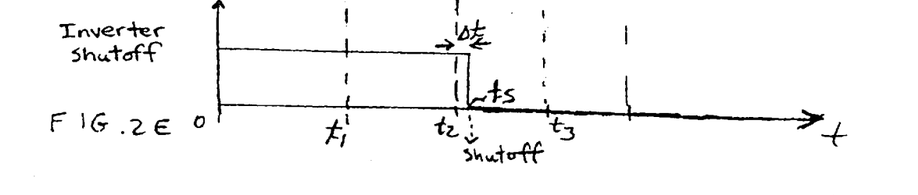

Referring now to FIGS. 2A–2E, in conjunction with FIG. 1, there are shown a series of timing diagrams associated with the occurrence of a short circuit of phase C of multiphase motor 500 with the chassis (occurring while switch Q5 is closed) for illustrating the operation of the AC ground fault detection system. As shown in FIG. 2A, upon occurrence at time t1 of an AC ground fault, (with transistor Q5 closed), the voltage across positive conductor 200 with respect to chassis drops in step fashion from voltage V2 of +300V to 0V. Beginning at time t1, the voltage across sensing capacitor C62 (FIG. 2B) decays from its initial value of +300V according to its RC time constant, until time t2. At time t2 switch Q5 opens, thereby terminating connection of the positive conductor 200 with chassis, and switch Q6 closes, thereby connecting the negative conductor with chassis. This causes the voltage across positive conductor 200 to rise in step fashion from 0V to +600V with respect to chassis. The voltage across sensing capacitor C62 begins to increase (between time t2 and t3) as shown in FIG. 2B. However, the entire voltage across the positive power conductor (i.e. +600V) with respect to chassis is not instantaneously applied across the sensing capacitor. Rather, the remaining voltage drop (in excess of +300V) is applied across the resistor network R1–R5 (see FIG. 1). This causes a step like increase in voltage ($V_+$) at the non-inverting input of the comparator 650 with respect to chassis (FIG. 2C). Thus, as shown in FIG. 2C, at time t2, the voltage at the non-inverting input exceeds that of the threshold or reference voltage Vth, thereby causing the output signal S1 output from the comparator to toggle from "LOW" (i.e. 0V) to "HIGH" (i.e. +5V) as shown in FIG. 2D. The "HIGH" output signal S1 output from the comparator operates to trigger controller 800 (see FIG. 1) operatively connected to switching mechanism 400 for turning off all switches Q1–Q6 in the switching mechanism, which occurs within a subsequent time $t_s$, of about 1 micro-second from comparator triggering. The rapid response time between the initial fault occurrence until detection and shutoff protects the external components (e.g. C2, C3) from damage. Controller 800 may comprise various well known types of control circuitry for implementing its control functions, including, for example, a digital signal processor (DSP) implemented in hardware or firmware resident on a printed circuit board for controlling switch operation. Alternatively, the controller may be implemented using software control logic or a combination of hardware, software andor programmable logic devices for controlling and managing switch operation. FIG. 2E illustrates the timing diagram for turning off the switches in response to triggering of the comparator output signal S1 indicative of a fault detection.

Note that, in the event inverter shutoff does not occur at time $t_s$ the comparator output would remain "HIGH" until time t3, when Q5 would again close, causing the voltage across positive conductor 200 to drop again to 0V with respect to chassis, thereby causing $V_+$ to drop below the reference voltage Vth and causing the signal S1 output from the comparator to again toggle "LOW". The dashed lines in FIGS. 2A–2D (and FIGS. 3A–3D) represent such waveforms. Note further that the controller may be configured to operate to shut off the switches in response any state transition (i.e. "HIGH" to "LOW" or "LOW" to "HIGH") of the comparator output.

Figures 3A, 3B:
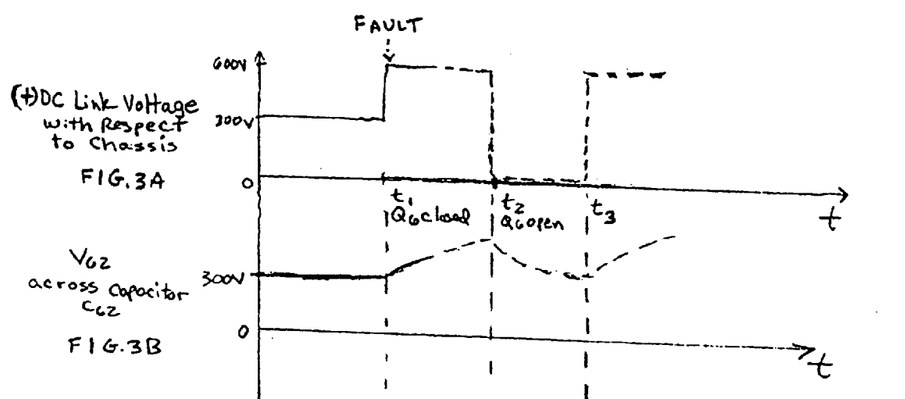
FIGS. 3A–3E illustrate a second series of timing diagrams associated with the occurrence of an unintended electric path such as a short circuit of a phase of an AC motor with the chassis.
Figure 3C:
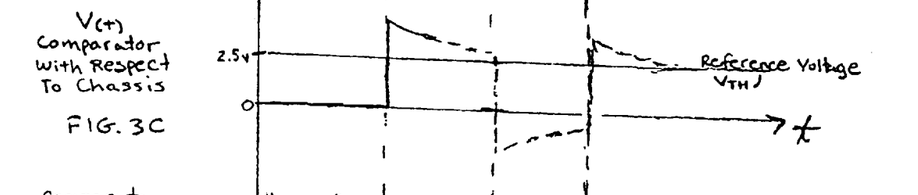
Figure 3D:
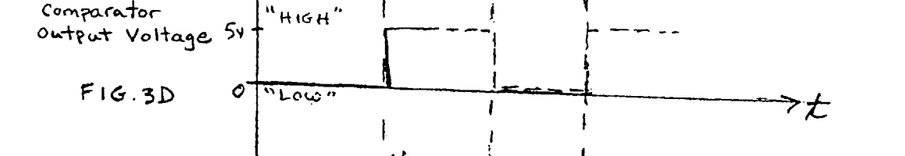
Figure 3E:
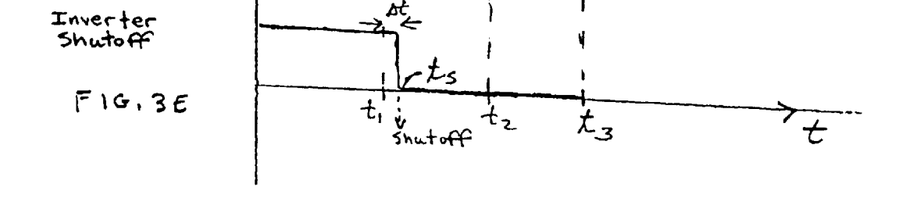

In analogous fashion to FIGS. 2A–2E, FIGS. 3A–3E show a series of timing diagrams associated with the occurrence of a short circuit of phase C of multi-phase motor 500 with the chassis while switch Q6 is closed. In this case, at time ti the voltage across positive conductor 200 rises in step fashion from its normal value of +300V to +600V with respect to chassis (FIG. 3A). As one can understand, the voltage across sensing capacitor C62 begins to increase as shown in FIG. 3B. However, the entire voltage across the positive power conductor is not instantaneously applied across the sensing capacitor. Rather, the remaining voltage drop (approximately 300V) is applied across the resistor network R1–R5 (see FIG. 1). This causes a step like increase of the comparator input ($V_+$) voltage (FIG. 3C) that exceeds the threshold voltage Vth, thereby generating a "HIGH" signal S1 at the output of the comparator (FIG. 3D). The "HIGH" output signal in turn causes controller 800 hardware andor software functionality to shut off or open the switches in switching mechanism 400 at time $t_s$ (FIG. 3E).

Figure 4:
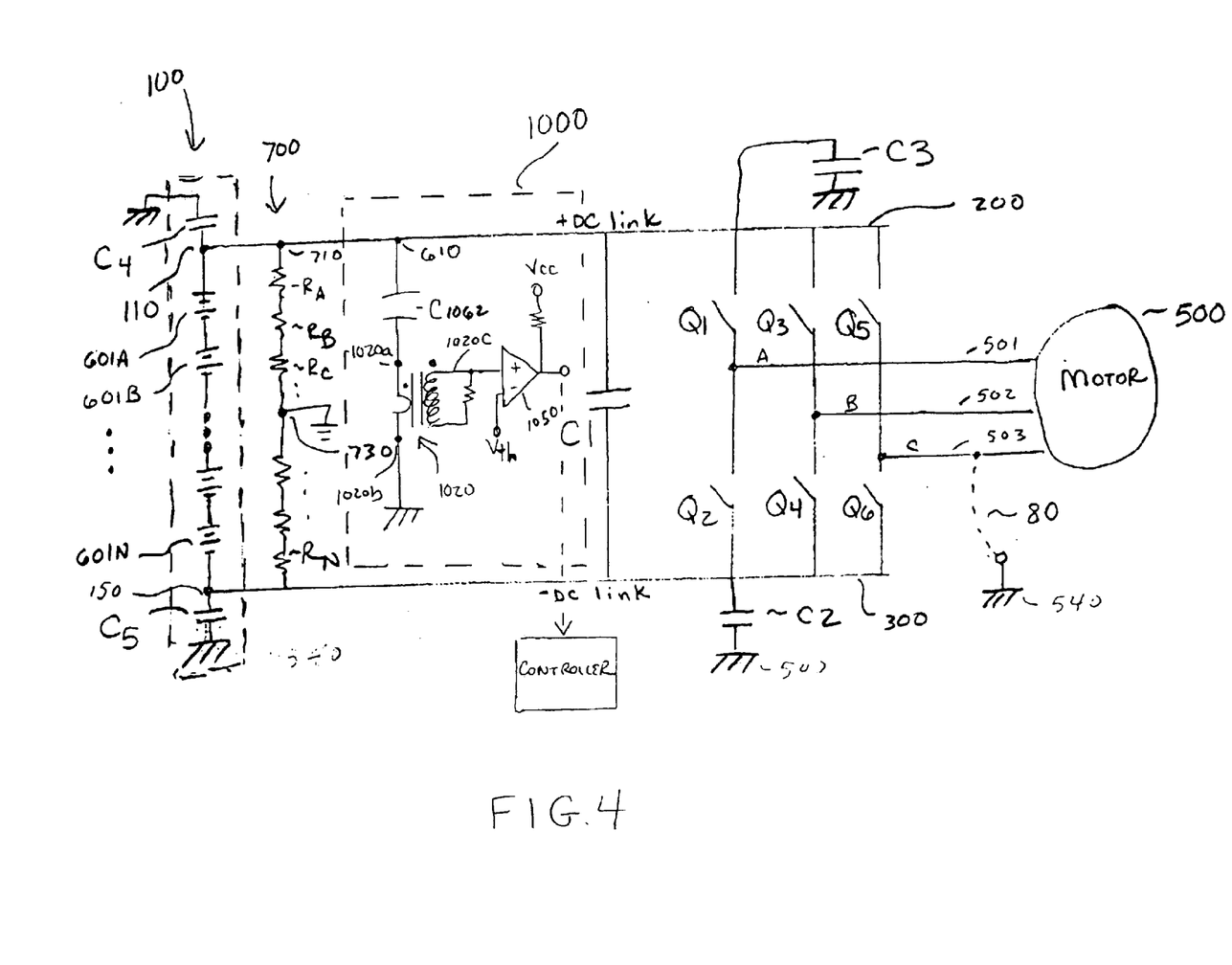
FIG. 4 shows a schematic illustration of an AC ground fault detection system according to another aspect of the present invention.

In accordance with another aspect of the invention, the AC ground fault detection circuit of FIG. 1 may be replaced with the configuration illustrated in FIG. 4. Like reference numerals have been used to indicate like parts. As shown, FIG. 4 depicts an AC ground fault detection circuit 1000 comprising a sense capacitor C1062 coupled between positive power conductor 200 and a first terminal 1020a of transformer 1020. Transformer 1020 has a second terminal 1020b coupled to reference potential. The output 1020c of the transformer is input to the non-inverting input of comparator 1050 for comparing with a threshold voltage Vth, in the same manner as described with respect to FIG. 1. In this manner, high voltage isolation can be performed through the sense capacitor or transformer 1020 while sensing the voltage change indicative of the ground fault condition. It should be noted that an advantageous feature of the ground fault detector circuit 1000 is that it can be PCB mounted to provide a compact, easily manufactured component for system integration.

Figure 5:
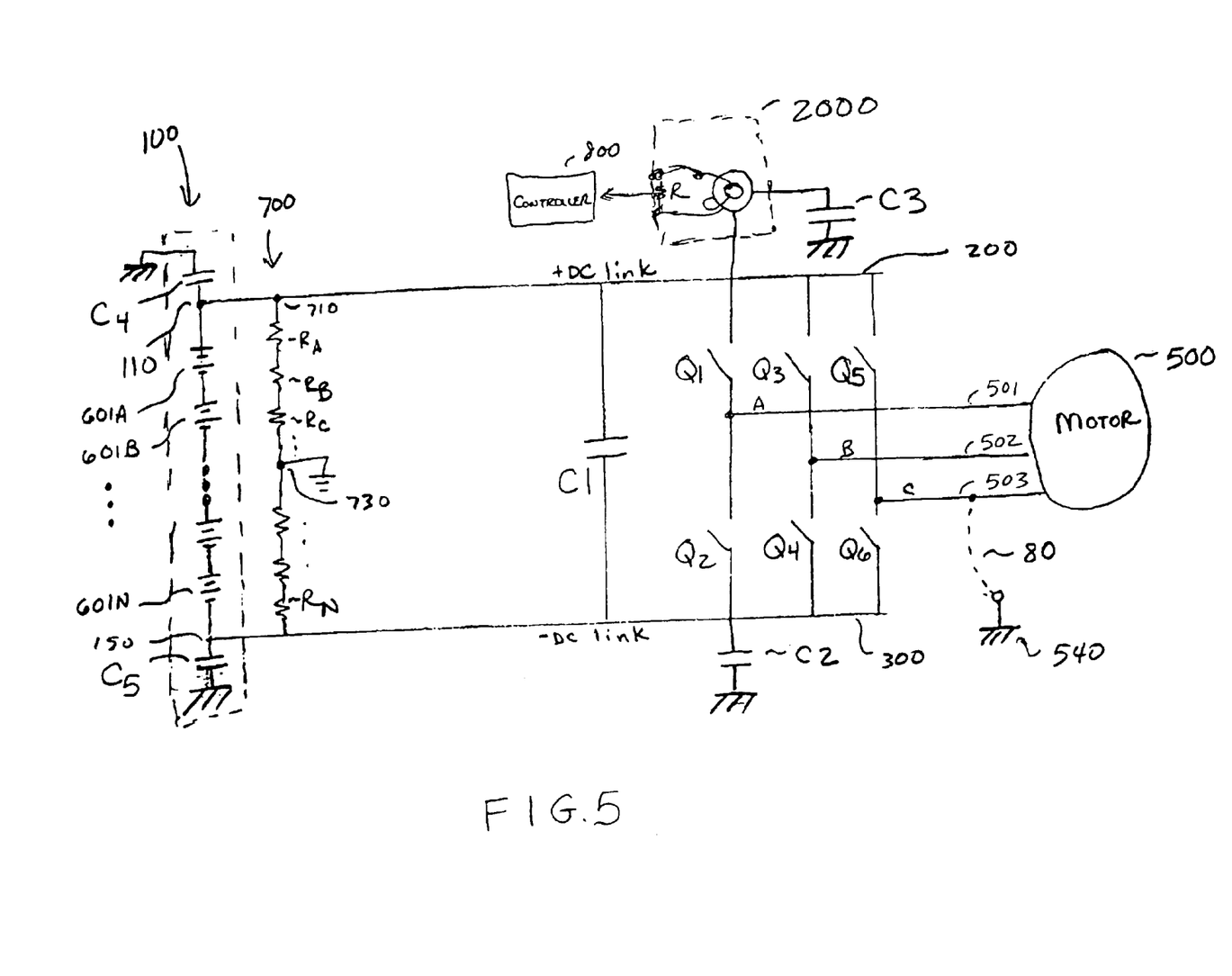
FIG. 5 shows a schematic illustration of an AC ground fault detection system according to yet another aspect of the present invention.

In another avatar of the invention, the AC ground fault detection circuit of FIG. 1 may be replaced with the configuration illustrated in FIG. 5 comprising a current sensor 2000 for detecting fluctuations in current caused by the AC ground fault. Again, like reference numerals have been used to indicate like parts. As shown in FIG. 5, the current sensor 2000 may be coupled at a first terminal to one of the power conductors, such as positive conductor 200, and at a second terminal to one of the external components such as capacitor C3. The current sensor may be implemented as a current transformer for sensing the increased snubber capacitor currents and generating via resistor $R_i$ an output signal to the controller circuitry 800 for interrupting the switches when the sensed current exceeds a predetermined threshold value.

Thus, a power system for driving a load 500 such as a multi-phase motor comprises a power distribution unit for distributing power via first and second power conductors (200, 300) to a corresponding phase leads (501, 502, 503) of the load according to a switching mechanism (400) which selectively couples a given lead of the load to one of the first and second power conductors at a predetermined switching rate. The first and second power conductors have first and second voltages, respectively, with respect to a reference potential (540). A capacitor (C2, C3) has a first terminal coupled to one of the first power conductor and second power conductor, and a second terminal coupled to the reference potential. A detector circuit (600) is coupled to the first power conductor and is operative for sensing a change in voltage across the first power conductor with respect to the reference potential indicative of an unintended electrical path (80) between the lead and the reference potential which causes the voltage developed across the first power conductor with respect to the reference potential to vary according to the magnitude of the power source, the detector generating a fault signal (S1) in response to the sensed voltage change exceeding a predetermined threshold (Vth). A controller (800) responsive to the fault signal is operative to interrupt power from the first and second power conductors to the load, thereby tending to eliminate the time varying voltage developed at one of the first and second power conductors in response to the unintended electrical path between the lead and the reference potential, from being discharged across the capacitor.

While the present invention has been described above in terms of specific embodiments, it is to be understood that the invention is not intended to be confined or limited to the embodiments disclosed herein. For example, while the ground fault detection circuit and system has been shown in accordance with an application for driving a motor or generator, any load may be used, including for example, driving into an inductor using a switch for example, from a +DC bus, and to a unidirectional device such as diode, for example, from a −DC bus for implementing a DC/DC converter or battery charger. Further, while capacitors C2, C3 have been shown coupled to the positive and negative power conductors, it is understood that, none or only one of the capacitors may be required, or that multiple capacitors may be used instead. Further, while the resistor network and sensing capacitor have been shown as a string of resistors (R1–R5) with the capacitor C62 coupled directly to the positive conductor, it is understood that that the capacitor may be coupled anywhere within the capacitor/resistor series network. Still further, it is understood that the resistor network may comprise any number of resistive devices and may be implemented as a single resistor if the voltage is clamped or if the application is such that the bus voltage is sufficiently low so that clamping is not required. In this case, a single resistor coupled to the positive power conductor and the sense capacitor coupled to reference potential would be implemented, whereby the detection circuitry would be adapted to trigger upon the voltage dropping below a predetermined threshold. Still further, a resistive or inductive coupling between one of the positive or negative power conductors, and chassis may replace the balanced impedance network 700 (see FIG. 1), such that the positive or negative DC link may be tied directly to chassis but still function due to parasitic inductance within the power conductor wires. These and all other such modifications and changes are considered to be within the scope of the appended claims.

What is claimed is:

1. An AC ground fault detector system for sensing an AC signal indicative of an unintended electrical path between a load driven by a DC power source and a reference potential, said system comprising:

a first power conductor coupled to a first terminal of said power source;

a second power conductor coupled to a second terminal of said power source;

a switching mechanism coupled to the first and second power conductors and operative for alternately connecting a phase of said load with the first and second power conductors according to a predetermined switching rate, whereby, during normal operation, voltages developed at the first power conductor and second power conductor are substantially constant with respect to a reference; and whereby, in the event of an occurrence of said unintended electrical path of at least one phase of the load with the reference potential, time varying voltages are developed at the first power conductor and second power conductor associated with the switching rate;

a detector comprising an input port coupled to the first power conductor for receiving the voltage or current signal on the first power conductor and having a capacitor coupled to said input port, said capacitor operable for performing one of a charging and discharging operation in response to said time varying voltage signal, said capacitor being coupled to said reference potential through an impedance device or transformer for generating a detected signal; a processing circuit for processing said detected signal and comparing with a threshold value; and an output port for generating an output signal based on said comparison; whereby the occurrence of the unintended electrical path between the load and reference potential causes a change in the voltage or current signal on the first power conductor of sufficient magnitude relative to the threshold value for detection by said detector such that the output signal of the detector is indicative of a detected fault.

2. The system of claim 1, further comprising a controller responsive to the output signal for interrupting power between the load and the first and second power conductors when the output signal is indicative of a detected fault.

3. The system of claim 2, wherein the power interruption occurs via switch openings within the switching mechanism.

4. The system of claim 1, further comprising a high impedance network having a first terminal coupled to the first power conductor, a second terminal coupled to the second power conductor, and a third terminal coupled to reference potential for equally balancing the voltages developed at the first and second power conductors with respect to the reference potential.

5. The system of claim 1, further comprising a first capacitor having a first terminal coupled to one of the first and second power conductors, and a second terminal coupled to the reference potential.

6. The system of claim 1, wherein said load comprises a multi-phase motor.

7. The system of claim 6, wherein said switching mechanism includes pairs of switches, each said pair of switches having a common terminal coupled to a respective phase of said multi-phase motor, and wherein for each of said pairs of switches, a first switch of said pair is operative for selectively coupling the first power conductor to the respective phase of said multi-phase motor, and a second switch of said pair of switches is operative for selectively coupling the second power conductor to the respective phase of said multi-phase motor.

8. A power system for driving a load, said power system comprising:

a power distribution unit for distributing power via first and second power conductors to a corresponding at least one lead of said load according to a switching mechanism which selectively couples a given lead of said load to one of said first and second power conductors at a predetermined switching rate, said first and second power conductors capacitively coupled to one another;

a capacitor having a first terminal coupled to one of the first power conductor and second power conductor, and a second terminal coupled to the reference potential; and a detector circuit coupled to the first power conductor, said detector circuit operative for sensing a change in voltage across said first power conductor with respect to the reference potential indicative of an unintended electrical path between at least one said lead and said reference potential, causing said voltage developed across said first power conductor to vary according to the magnitude of the power source, said detector generating a fault signal in response said sensed voltage change exceeding a predetermined threshold, wherein said detector circuit comprises a capacitor having a first terminal coupled to the first power conductor and a second terminal coupled to a first terminal of a resistor network or transformer, said resistor network or transformer having a second terminal coupled to said reference potential, said capacitor operable for performing one of a charging and discharging operation in response to said sensed change in voltage, and wherein said fault signal is generated in response to a comparison of a signal resulting from said sensed change in voltage relative to said reference potential; and a controller responsive to the fault signal for interrupting power from the first and second power conductors to the load, thereby tending to eliminate the time varying voltage developed at one of the first and second power conductors in response to the unintended electrical path between said least one lead and said reference potential, from being discharged across said capacitor.

9. The system of claim 8, further comprising a high impedance network coupled between the first and second power conductors for equally balancing the power distributed from the power distribution unit between a maximum positive voltage and minimum negative voltage with respect to the reference potential.

10. A method for detecting an unintended electrical path between a phase lead of a motor and reference potential during power servicing of the motor by a power unit, the motor being selectively coupled to one of first and second power conductors according to a switching mechanism at a predetermined switching rate, and wherein an at least one capacitor is coupled between one of the first power conductor and second power conductor, and the reference potential, the method including steps of:

receiving at said first power conductor a time varying voltage signal in the form of a square wave having a peak value corresponding to the magnitude of the voltage of the power source and indicative of the occurrence of said unintended electrical path;

capacitively coupling said received voltage signal through one of an impedance network and a transformer connected to said reference potential to obtain a detected signal;

comparing said detected signal with a threshold value; and interrupting the servicing of power to the motor when the detected signal exceeds the threshold value.

11. The method of claim 10, wherein the step of interrupting comprises opening switches within the switching mechanism that selectively couples the motor to the first and second power conductors.

12. The method of claim 10, further comprising the step of providing a high impedance network between the first and second power conductors for equally balancing the voltages developed at the first and second power conductors with respect to the reference potential.

* * * * *